(12) United States Patent
Ngo et al.

(10) Patent No.: US 6,818,557 B1
(45) Date of Patent: Nov. 16, 2004

(54) METHOD OF FORMING SIC CAPPED COPPER INTERCONNECTS WITH REDUCED HILLOCK FORMATION AND IMPROVED ELECTROMIGRATION RESISTANCE

(75) Inventors: Minh Van Ngo, Fremont, CA (US); Christine Hau-Riege, Fremont, CA (US); Steve Avanzino, Cupertino, CA (US); Robert A. Huertas, Hollister, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 128 days.

(21) Appl. No.: 10/317,053

(22) Filed: Dec. 12, 2002

(51) Int. Cl.[7] .................. H01L 21/44; H01L 21/302
(52) U.S. Cl. ............. 438/687; 438/658; 438/707; 438/710; 438/775
(58) Field of Search ............... 438/627, 687, 438/643, 653, 658, 707, 710, 714, 775, 776, 798

(56) References Cited

U.S. PATENT DOCUMENTS 6,429,115 B1 * 8/2002 Tsai et al. ............... 438/622
6,506,677 B1 * 1/2003 Avanzino et al. ......... 438/687
6,525,428 B1 * 2/2003 Ngo et al. ................ 257/774
2002/0123218 A1 * 9/2002 Shioya et al.
2003/0224599 A1 * 12/2003 Zisti et al.

* cited by examiner

Primary Examiner—Ha Tran Nguyen

(57) ABSTRACT

The electromigration resistance of capped Cu or Cu alloy interconnects is significantly improved and hillock formation is significantly reduced by sequentially and contiguously treating the exposed planarized surface of in-laid Cu with a plasma containing $NH_3$ and $N_2$, ramping up the introduction of trimethylsilane and then initiating deposition of a silicon carbide capping layer. Embodiments include treating the exposed surface of in-laid Cu with a soft $NH_3$ plasma diluted with $N_2$, shutting off the power, discontinuing the $N_2$ flow and introducing He, then ramping up the introduction of trimethylsilane in three stages, and then initiating plasma enhanced chemical vapor deposition of a silicon carbide capping layer, while maintaining substantially the same temperature of 335° C. throughout plasma treatment and silicon carbide capping layer deposition. Embodiments also include forming Cu dual damascene structures formed in dielectric material having a dielectric constant (k) less than 3.9.

20 Claims, 2 Drawing Sheets

METHOD OF FORMING SIC CAPPED COPPER INTERCONNECTS WITH REDUCED HILLOCK FORMATION AND IMPROVED ELECTROMIGRATION RESISTANCE

TECHNICAL FIELD

The present invention relates to copper (Cu) and/or Cu alloy metallization in semiconductor devices, particularly to a method for forming reliably capped Cu or Cu alloy interconnects, such as single and dual damascene structures formed in low dielectric constant materials. The present invention is particularly applicable to manufacturing high speed integrated circuits having submicron design features, and high conductivity interconnects with improved electromigration resistance.

BACKGROUND ART

The escalating requirements for high density and performance associated with ultra large scale integration semiconductor wiring require responsive changes in interconnection technology. Such escalating requirements have been found difficult to satisfy in terms of providing a low R×C (resistance×capacitance) interconnect pattern with electromigration resistance, particularly wherein submicron vias, contacts and trenches have high aspect ratios imposed by miniaturization.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer such as TaN, lining the opening and on the surface of the interlayer dielectric, filling the opening with Cu or a Cu alloy layer, CMP, and forming a silicon nitride capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to removal, as by peeling due to scratching or stresses resulting from subsequent deposition of layers. As a result, the Cu or Cu alloy is not entirely encapsulated and Cu diffusion occurs, thereby adversely affecting device performance and decreasing the electromigration resistance of the Cu or Cu alloy interconnect member.

The adhesion of a silicon nitride capping can be improved by treating the surface of a Cu or Cu alloy layer with a plasma containing nitrogen and ammonia, followed by depositing the silicon nitride capping layer in the presence of nitrogen in the same reaction chamber. However, it was found that silicon nitride capped Cu or Cu alloy interconnects, as in damascene and dual damascene structures, exhibited poor electromigration resistance, particular in those cases wherein the exposed surface of the Cu or Cu alloy was treated with a plasma to remove a copper oxide surface film prior to deposition of the silicon nitride capping layer. Such poor electromigration resistance can be improved by treating an upper surface of inlaid Cu or Cu alloy metallization using a relatively soft $NH_3$ plasma heavily diluted with $N_2$.

However, the use of silicon nitride as a capping layer for Cu or Cu alloy metallization adversely impacts interconnect capacitance, because of the relatively high dielectric constant (k) of silicon nitride, e.g., a dielectric constant (k) of 6 to 8. This adverse impact on interconnect capacitance becomes increasingly problematic as the design rules extend deeper into the submicron range, such as about 0.12 micron and under. In addition, as the design rules plunge deeper into the sub-micron regime, electromigration and hillock formation become increasingly problematic. Accordingly, there exists a continuing need for methodology enabling the formation of encapsulated Cu and Cu alloy interconnects for vertical metallization levels with greater accuracy, reliability, reduced capacitance, reduced hillock formation and improved electromigration resistance. There exists a particular continuing need for methodology enabling the formation of capped Cu or Cu alloy interconnects, particularly in damascene structures, e.g., dual damascene structures formed in dielectric material having a low dielectric constant (k), with improved reliability, reduced capacitance, reduced hillock formation and improved electromigration resistance.

DISCLOSURE OF THE INVENTION

An advantage of the present invention is a method of manufacturing a semiconductor device having highly reliable capped Cu or Cu alloy interconnect.

Another advantage of the present invention is a method of manufacturing a semiconductor device comprising a silicon carbide capped Cu or Cu alloy interconnect member with reduced interconnect capacitance, reduced hillock formation and high electromigration resistance.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising the sequential steps: (a) introducing a wafer containing inlaid copper (Cu) or a Cu alloy into a chamber; (b) treating an exposed surface of the Cu or Cu alloy with a plasma under an RF power while introducing ammonia ($NH_3$) and nitrogen ($N_2$) into the chamber; (c) shutting off the RF power, discontinuing introducing $N_2$ and introducing helium (He) into the chamber; (d) ramping up the introduction of trimethylsilane (TMS) into the chamber in a plurality of stages; and (e) depositing a silicon carbide capping layer on the surface of the Cu or Cu alloy in the chamber.

Embodiments of the present invention include plasma treating the exposed surface of inlaid Cu with a soft plasma comprising $NH_3$ heavily diluted with $N_2$, and maintaining the temperature at 300° C. to 350° C., e.g., 335° C., throughout steps (b), (c), (d) and (e). Embodiments of the present invention further include conducting step (d) in three stages. During the first stage ($d_1$), TMS is introduced until a flow rate of 32 to 48 sccm, e.g., 40 sccm, is achieved, followed by stage ($d_2$) during which the TMS flow rate is increased to 96 to 144 sccm, e.g., 120 sccm, followed by stage ($d_3$) during which the TMS flow rate is increased to 128 to 192 sccm, e.g., 160 sccm. Each of stages ($d_1$), ($d_2$) and ($d_3$) is typically conducted for 4 to 6 seconds, e.g., 5 seconds. Subsequently, a suitable RF power is applied, such as 240 to 360 watts, to implement PECVD of the silicon carbide capping layer, as at a thickness of 400 Å to 600 Å.

Embodiments of the present invention further include single and dual damascene techniques comprising forming an opening in an interlayer dielectric on a wafer, depositing an underlying diffusion barrier layer, such as Ta and/or TaN, lining the opening and on the interdielectric layer, depositing a seedlayer, depositing the Cu or a Cu alloy layer on the diffusion barrier layer filling the opening and over the interlayer dielectric, removing any portion of the Cu or Cu alloy layer beyond the opening by CMP, leaving an exposed surface oxidized, and conveying the wafer into the deposition chamber for processing in accordance with embodiments of the present invention by treating the exposed surface of the Cu or Cu alloy layer with a soft plasma employing a relatively low $NH_3$ flow rate and a relatively high $N_2$ flow rate, ramping up the introduction of TMS and then depositing a silicon carbide capping layer on the treated surface.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
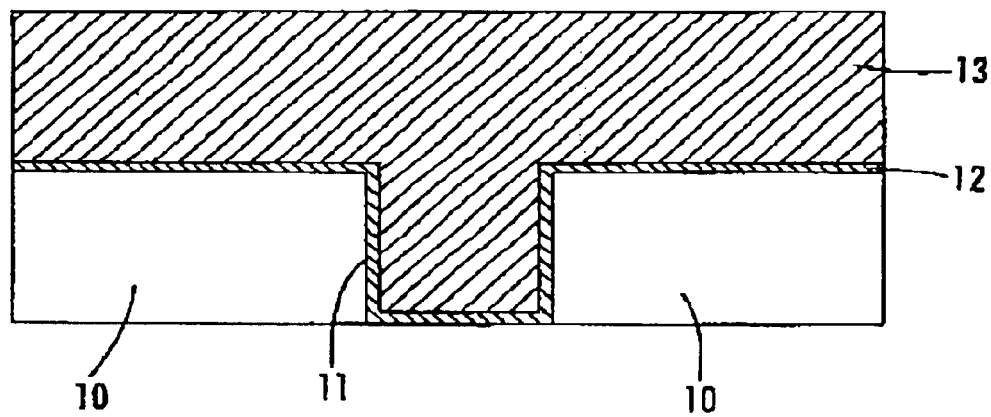
FIGS. 1–4 schematically illustrate sequential phases of a method in accordance with an embodiment of the present invention.

The present invention addresses and solves reliability, high capacitance, hillock formation and electromigration problems attendant upon forming capped Cu or Cu alloy interconnects by depositing a silicon carbide capping layer in a plurality of sequential and contiguous steps designed to improve reliability, improve electromigration resistance, reduce hillock formation and increase manufacturing throughput. Methodology in accordance with embodiments of the present invention enables a significant improvement in the adhesion of a silicon carbide capping layer to a Cu or Cu alloy interconnect member, thereby preventing capping layer peeling and preventing copper diffusion. In addition, embodiments of the present invention significantly reduce hillock formation, and significantly improve electromigration resistance, and significantly improve wafer-to-wafer uniformity. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep submicron range, such as about 0.12 micron and under, the capacitance and electromigration resistance of encapsulated Cu interconnect members becomes increasingly significant. It was found that conventional practices in forming a Cu interconnect member in a damascene opening, e.g., a dual damascene opening, result in the formation of a thin copper oxide surface film, believed to comprise a mixture of CuO and $Cu_2O$ formed during CMP. The thin copper oxide surface film layer is porous and brittle in nature. The presence of such a thin copper oxide surface film undesirably reduces capping layer adhesion to the underlying Cu and/or Cu alloy interconnect member. Consequently, cracks are generated at the Cu or Cu alloy/copper oxide interface, resulting in copper diffusion and increased electromigration as a result of such diffusion. The cracks occurring in the Cu or Cu alloy/copper oxide interface enhance surface diffusion, which is more rapid than grain boundary diffusion or lattice diffusion. Silicon nitride Cu interconnects are also characterized by hillock formation and a relatively high interconnect capacitance by virtue of the relatively high dielectric constant (k) of silicon nitride, i.e., a dielectric constant (k) of 7 to 8.

The present invention addresses and solves such Cu interconnect problems by depositing a silicon carbide capping layer under conditions designed to avoid such problems while increasing production and reducing manufacturing costs. Silicon carbide has a relatively lower dielectric constant (k) of 3.5 to 4.8, thereby enabling an overall reduction in interconnect capacitance. Further, silicon carbide can be deposited at a relatively lower temperature than silicon nitride by PECVD. For example, a silicon nitride capping layer is typically deposited by PECVD at a temperature of about 400° C. whereas, in accordance with embodiments of the present invention, a silicon carbide capping layer is deposited at a relatively lower temperature, e.g., 335° C. In addition, the present invention enables the sequential plasma treatment and silicon carbide capping layer deposition in a shorter period of time vis-à-vis, silicon nitride, i.e., at a saving of 50 to 60 seconds per wafer. The utilization of a lower temperature and faster processing significantly reduces the formation of hillocks which are believed to result from the extended period of time during which the unconstrained Cu interconnect is held at elevated temperatures during sequential plasma treatment and silicon nitride capping layer deposition. In accordance with the embodiments of the present invention, the low temperature of 300° C. to 350° C., e.g., 335° C., is maintained throughout plasma treatment, TMS ramp up and silicon carbide capping layer deposition.

In accordance with embodiments of the present invention, a wafer containing in-laid Cu having an exposed surface with a copper oxide film believed to be generated by CMP is introduced into a deposition chamber. A $N_2$ flow rate of 8,000 to 9,200 sccm, e.g., 8,600 sccm, and an $NH_3$ flow rate of 234 to 336 sccm, e.g., 280 sccm, is established. A pressure of about 3 to about 5 Torr and temperature of about 300° C. to 350° C., e.g, 335° C., are also established. A plasma is then initiated, as after about 10 to about 15 seconds, typically about 15 seconds, by applying an RF power of about 50 watts to about 200 watts, and the exposed surface of the in-laid Cu is treated with a soft $NH_3$ plasma to reduce the copper oxide film, typically for 8 to 12 seconds, e.g., 10 seconds.

In accordance with embodiments of the present invention, the power is turned off after plasma treatment, the introduction of $N_2$ is discontinued, the pressure is reduced to 2 to 4 Torr, He is introduced at a flow rate of 320 to 480 sccm, e.g., 400 sccm, and the $NH_3$ flow rate is increased to 286 to 402 sccm, e.g., 335 sccm, while maintaining the temperature at 335° C. After 5 to 7 seconds, TMS is gradually introduced into the chamber while maintaining the temperature of 335° C. The TMS flow rate is ramped up to a suitable deposition flow rate, as in a plurality of stages. For example, TMS may be introduced during a first stage until a flow rate of 32 to 48 sccm, e.g., 40 sccm, is achieved, as for about 5 seconds, followed by a second stage during which the TMS flow rate is increased to 96 to 144 sccm, e.g., 120 sccm, for about 5 seconds, after which the TMS flow rate is increased to 128 to 192 sccm, e.g., 160 sccm in 5 seconds. After the TMS has achieved a suitable flow rate, e.g., 160 sccm, the RF power is again turned on, as at 240 to 360 watts, thereby generating a plasma and depositing a capping layer of silicon carbide on the treated Cu surface, while maintaining the pressure of 2 to 4 Torr and temperature of 335° C., as for a period of 15 to 23 seconds, e.g., 19 seconds. The resulting silicon carbide capping layer typically has a thickness of 400 Å to 600 Å, e.g., 500 Å.

The mechanism underpinning the significant reduction in hillock formation and, hence, electromigration performance, attendant upon implementing the inventive methodology disclosed herein is not known with certainty. However, it is believed that deposition of silicon carbide as a capping layer enables rapid deposition at a lower deposition temperature, e.g., 335° C. Therefore, the time and power at which the unconstrained Cu interconnect is exposed to elevated temperatures is reduced. In addition, the soft plasma treatment employing a high $N_2$ flow rate and low $NH_3$ flow rate avoids sensitizing the clean Cu surface, thereby reducing its reactivity. Moreover, the slow introduction of TMS avoids a sudden assault of the Cu surface with a violent surge of reactant species, thereby further preventing reactions which adversely impact electromigration.

Improved electromigration resistance of capped Cu interconnects formed in accordance with embodiments of the present invention was confirmed by lognormal sigma measurements. Lognormal sigma is a measure of spread in electromigration (EM) data (failure times). Higher signma leads to a lower projected EM lifetime at use conditions. The product EM lifetime is calculated by the following eqn: Lifetime=T50% exp(-N* sigma) where T50% is Median time to fail (MTTF) and N=6 for T0.1% failure rate and product factor of about $10^6$. Therefore, higher values of sigma could cause a significant degradation in projected lifetime due to the exponential dependence. The inventive process flow disclosed herein not only improves T50% but also give a tight sigma, which leads to higher projected DM lifetime.

Cu interconnects formed in accordance with embodiments of the present invention can be, but are not limited to, interconnects formed by damascene technology. Thus, embodiments of the present invention include forming an interlayer dielectric overlying a substrate, forming an opening, e.g., a damascene opening, in the interlayer dielectric, depositing a diffusion barrier layer, such as Ta and/or TaN, and filling the opening with Cu. Advantageously, the opening in the interlayer dielectric can be filled by initially depositing a seed layer and then electroplating or electrolessly plating the Cu. Typical seedlayers include Cu alloys containing magnesium, aluminum, zinc, zirconium, tin, nickel, palladium, silver or gold in a suitable amount, e.g., about 0.3 to about 12 at %. CMP is then performed such that the upper surface of the inlaid Cu is substantially coplanar with the upper surface of the interlayer dielectric. As a result of CMP, a thin film of copper oxide is typically formed. The exposed oxidized surface of the Cu is then processed in accordance with an embodiment of the present invention, thereby substantially eliminating or significantly reducing surface contamination and surface reaction and, hence, significantly reducing electromigration failures.

In accordance with embodiments of the present invention, the damascene opening can also be filled with Cu by PVD at a temperature of about 50° C. to about 150° C. or by CVD at a temperature under about 200° C. In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron-and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

An embodiment of the present invention is schematically illustrated in FIGS. 1–4, wherein similar reference numerals denote similar elements or features. Adverting to FIG. 1, damascene opening 11, such as a contact or via hole, is formed in dielectric layer 10, e.g., a low-k material. It should be understood that opening 11 can also be formed as a dual damascene opening comprising a contact or via hole section in communication with a trench section. A barrier layer 12 is deposited, such as Ta and/or TaN, and Cu layer 13 is then deposited. Upon electroplating or electroless plating layer 13, a seed layer (not shown) is deposited on barrier layer 12.

Figure 2:
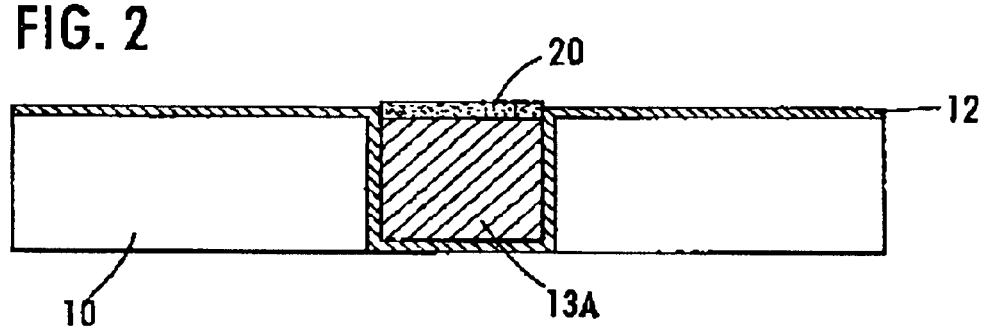

Adverting to FIG. 2, the portions of the Cu alloy layer 13 extending beyond opening 11 are removed, as by CMP. As a result, a thin film of copper oxide 20 is formed on the exposed surface of the Cu interconnect member 13A. The wafer containing the Cu metallization is then introduced into deposition chamber and processed in accordance with embodiments of the present invention.

Figure 3:
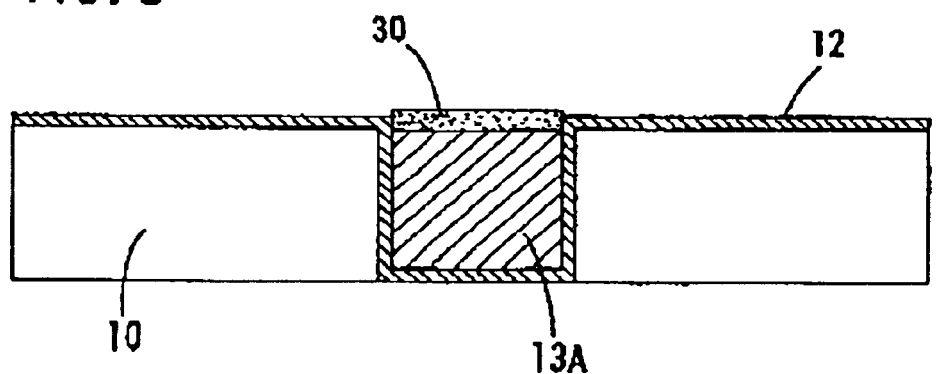

Adverting to FIG. 3, in accordance with embodiments of the present invention, the exposed surface of the Cu interconnect member 13A having a thin copper oxide film 20 thereon is treated with a soft plasma at a relatively low $NH_3$ flow rate and a relatively high $N_2$ flow rate to remove or substantially reduce the thin copper oxide film 20 leaving a clean, sensitized and highly reactive Cu surface 30. At this point, the power is discontinued, the pressure reduced, the introduction $N_2$ discontinued, the flow rate of $NH_3$ increased and He is introduced. This step conducted for about 5 to 7 seconds. The introduction of TMS is then ramped up in a plurality of stages, e.g., three stages, to a suitable deposition flow rate, e.g., 160 sccm.

Figure 4:
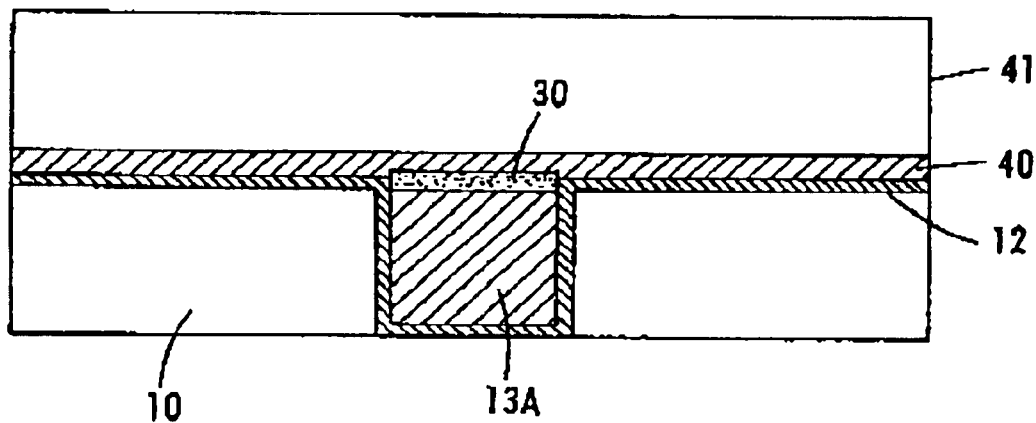

As illustrated in FIG. 4, a plasma is then generated by turning on the RF power and silicon carbide capping layer 40 is deposited on the cleaned exposed surface 30 of Cu interconnect 13A. Another interlayer dielectric 41 is then deposited, such as a low-k material. In this way, a plurality of interlayer dielectrics and metallization patterns are built up on a semiconductor substrate and various interconnects are formed.

Advantageously, the inventive methodology enables a reduction in the amount of time and power during which the unconstrained in-laid Cu is exposed, thereby significantly reducing hillock formation and, hence, electromigration failures. Moreover, the interface between the Cu interconnect and silicon carbide capping layer is substantially free of contamination and reaction products which would otherwise adversely affect adhesion therebetween, and adversely impact electromigration resistance, thereby improving the accuracy and reliability of interconnects for subsequent metallization levels and reducing electromigration failures The present invention enables the formation of extremely reliable capped Cu and/or Cu alloy interconnect members by significantly reducing hillock formation. In addition, the inventive methodology significantly reduces surface-contamination and reaction products at the interface between a plasma treated copper surface and silicon carbide capping layer deposited thereon, thereby enhancing the adhesion of the capping layer and reducing electromigration failures. Thus, the present invention significantly improves the reliability of Cu interconnect members by enhancing adhesion of the silicon carbide capping layer with an attendant reduction in copper diffusion. In addition, the present invention enables a significant reduction in hillock formation and, hence, a significant increase in electromigration resistance. The use of silicon carbide as a capping layer results in reduction in the interconnect capacitance vis-à-vis a silicon nitride capped interconnect. Consequently, the present invention advantageously reduces capping layer peeling, reduces copper diffusion, reduces hillock formation, enhances electromigration resistance, improves device reliability, improves wafer-to-wafer uniformity, reduces interconnect capacitance, increases operating speed, increases production throughput and reduces manufacturing costs.

The present invention enjoys industrial applicability in the formation of various types of inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising the sequential steps:

(a) introducing a wafer containing inlaid copper (Cu) or a Cu alloy into a chamber;

(b) treating an exposed surface of the Cu or Cu alloy with a plasma under an RF power while introducing ammonia ($NH_3$) and nitrogen ($N_2$) into the chamber;

(c) shutting off the RF power, discontinuing introducing $N_2$, reducing pressure in the chamber to 2 to 4 Torr; and introducing helium (He) into the chamber;

(d) ramping up the introduction of trimethylsilane (TMS) into the chamber in a plurality of stages; and (e) depositing a silicon carbide capping layer on the surface of the Cu or Cu alloy in the chamber.

2. The method according to claim 1, comprising conducting step (d) by ramping up the introduction of TMS into the chamber in three stages.

3. The method according to claim 2, wherein step (d) comprises the sequential stages:

($d_1$) introducing TMS at a flow rate of 32 to 48 sccm;

($d_2$) increasing the flow rate of TMS to 96 to 144 sccm; and ($d_3$) increasing the flow rate of TMS to 128 to 192 sccm before initiating deposition of the silicon carbide capping layer.

4. The method according to claim 3, comprising conducting each of stages ($d_1$), ($d_2$), and ($d_3$) for 4 to 6 seconds.

5. The method according to claim 1, comprising conducting each of steps (b), (c), (d), and (e) at substantially the same temperature.

6. The method according to claim 5, comprising conducting each of steps (b), (c), (d), and (e) at a temperature of 300° C. to 350° C.

7. The method according to claim 1, comprising conducting steps (b), (c), (d), and (e) for a total time of 37 to 63 seconds.

8. The method according to claim 1, wherein step (b) comprises:

generating an RF power of 50 to 200 watts;

generating a $N_2$ flow rate of 8,000 to 9,000 sccm;

generating an $NH_3$ flow rate of 234 to 336 sccm;

elevating the temperature to 300° C. TO 350° C.;

elevating the pressure to 3 to 5 Torr.

9. The method according to claim 8, wherein step (c) comprises:

increasing the $NH_3$ flow rate to 268 to 402 sccm; and introducing He at a flow rate of 320 to 480 sccm.

10. The method according to claim 9, wherein step (d) comprises three sequential stages of:

($d_1$) introducing TMS at a flow rate of 32 to 48 sccm;

($d_2$) increasing the flow rate of TMS to 96 to 144 sccm; and ($d_3$) increasing the flow rate of TMS to 128 to 192 sccm before initiating deposition of the silicon nitride capping layer.

11. The method according to claim 10, wherein step (e) comprises:

maintaining the pressure at 2 to 4 Torr; and initiating an RF power of 240 watts to 360 watts.

12. The method according to claim 11, comprising conducting:

step (b) for 5 to 15 seconds;

step (c) for 5 to 7 seconds;

stage ($d_1$) for 4 to 6 seconds;

stage ($d_2$) for 4 to 6 seconds;

stage ($d_3$) for 4 to 6 seconds; and step (e) for 15 to 23 seconds.

13. The method according to claim 12, comprising depositing the silicon carbide capping layer at a thickness of 400 Å to 600 Å.

14. The method according to claim 13, wherein the dielectric layer has a dielectric constant (k) less than about 3.9.

15. The method according to claim 1, wherein the wafer contains a dual damascene structure comprising a Cu or a Cu alloy line in contact with an underlying Cu or Cu alloy via formed in a dielectric layer.

16. A method of manufacturing a semiconductor device, the method comprising the following sequential steps:

(a) introducing a wafer containing a copper (Cu) or Cu alloy interconnect into a deposition chamber, introducing nitrogen ($N_2$) at a flow rate of 8,000 to 9,000 sccm, introducing ammonia ($NH_3$) at a flow rate of 234 to 336 sccm, elevating the temperature to 300° C. to 350° C. and elevating the pressure to 3 to 5 Torr;

(b) generating a plasma at a RF power of about 50 to about 200 watts, and treating an exposed surface of the Cu or Cu alloy interconnect with a plasma containing $NH_3$ and $N_2$ to remove oxide thereon;

(c) shutting off the RF power, discontinuing introducing $N_2$, reducing the pressure to 2 to 4 Torr, introducing helium (He) into the chamber at a flow rate of 320 to 480 sccm; and increasing the $NH_3$ flow rate to 286 to 402 sccm;

(d) gradually introducing trimethylsilane (TMS) into the deposition chamber, while maintaining the temperature at 300° C. to 350° C., in the following sequential stages:

($d_1$) introducing TMS at a flow rate of 32 to 48 sccm; and ($d_2$) increasing the flow rate of TMS to 96 to 144 sccm; and ($d_3$) increasing the flow rate of TMS to 128 to 192 sccm; and (f) maintaining the pressure at 2 to 4 Torr, generating a plasma at an RF power of 240 to 360 watts and depositing a silicon carbide capping layer on the Cu or Cu alloy surface in the deposition chamber while maintaining the temperature at 300° C. to 350° C.

17. The method according to claim 16, comprising conducting step (b) for 5 to 15 seconds;
step (c) for 5 to 7 seconds;
stage ($d_1$) for 4 to 6 seconds;
stage ($d_2$) for 4 to 6 seconds;
stage ($d_3$) for 4 to 6 seconds; and
step (e) for 15 too 23 seconds.

18. The method according to claim 16, comprising depositing the silicon carbide capping layer at a thickness of 400 Å to 600 Å.

19. The method according to claim 16, wherein the wafer comprises a dual damascene structure comprising a Cu or Cu alloy line in contact with an underlying Cu or Cu alloy via formed in a dielectric layer.

20. The method according to claim 19, wherein the dielectric layer has a dielectric constant (k) less than about 3.9.

* * * * *